United States Patent
Baek et al.

(10) Patent No.: US 7,956,785 B2
(45) Date of Patent: Jun. 7, 2011

(54) RETURN TO ZERO DIGITAL TO ANALOG CONVERTER AND CONVERTING METHOD THEREOF

(75) Inventors: Kwang-Hyun Baek, Seoul (KR); Hong Chang Yeoh, Seoul (KR); Jae-Hun Jung, Seoul (KR); Yun-Hwan Jung, Seoul (KR); Joon Hyun Baek, Gyeonggi-do (KR)

(73) Assignee: Chung-Ang University Industry-Academy Cooperation Foundation, Seoul (KR)

( * ) Notice: Subject to any disclaimer, the term of this patent is extended or adjusted under 35 U.S.C. 154(b) by 0 days.

(21) Appl. No.: 12/647,616

(22) Filed: Dec. 28, 2009

(65) Prior Publication Data

US 2011/0043399 A1    Feb. 24, 2011

(30) Foreign Application Priority Data

Aug. 19, 2009   (KR) .......................... 10-2009-0076719

(51) Int. Cl.
    *H03M 1/66* (2006.01)
(52) U.S. Cl. .......................................... 341/144; 341/67
(58) Field of Classification Search ............. 341/67–144
    See application file for complete search history.

(56) References Cited

U.S. PATENT DOCUMENTS

| | | | | |
|---|---|---|---|---|
| 6,462,687 | B1* | 10/2002 | Eshraghi et al. | 341/143 |
| 6,476,748 | B1* | 11/2002 | Galton | 341/144 |
| 7,042,379 | B2* | 5/2006 | Choe | 341/144 |
| 7,576,675 | B1  | 8/2009  | Lee | |

OTHER PUBLICATIONS

Myung-Jun Choe; A 1.6 GS/s 12-bit Return-to-Zero GaAs RF DAC for Multiple Nyquist Operation: IEEE Journal of Solid-State Circuits; vol. 40, No. 12; Dec. 2005; pp. 2456-2468.
Korean Office Action for corresponding Korean patent application; Korean patent application number 10-2009-0076719; office action issued on Mar. 8, 2011.
English translation of Korean Office action (Non-patent literature document No. 2).

* cited by examiner

*Primary Examiner* — Lam T Mai
(74) *Attorney, Agent, or Firm* — John L. DeAngelis; Beusse Wolter; Sanks Mora & Maire, P.A.

(57) ABSTRACT

The present invention relates to a digital to analog converter, to a return-to-zero digital to analog converter with improved wideband characteristics by enabling a return-to-zero output without separate clock and controller, and a converting method thereof. Since the return-to-zero digital to analog converter and the converting method thereof are capable of outputting an RZ output without directly providing a clock signal to an analog circuit by configuring a switch for generating a zero point signal and a differential pipeline for providing a differential signal to control the switch according to input digital data using a differential structure, the converter can provide wideband characteristics and high dynamic performance.

20 Claims, 7 Drawing Sheets

| CLOCK | SIGNAL A | SIGNAL B | MODE |
|---|---|---|---|
| H | H | H | |
| L | L | L | Zero |
| H | L | H | |
| L | L | L | Zero |
| H | H | L | |
| L | L | L | Zero |

RETURN TO ZERO DIGITAL TO ANALOG CONVERTER AND CONVERTING METHOD THEREOF

BACKGROUND OF THE INVENTION

1. Field of the Invention

The present invention relates to a digital to analog converter, to a return-to-zero digital to analog converter with improved wideband characteristics by enabling a return-to-zero output without separate clock and controller, and a converting method thereof.

2. Description of the Related Art

With the advent of high speed wideband processing system with development of information communications, there is an increasing need of a digital to analog converter (DAC) which is capable of synthesizing analog signals of a desired frequency band at high speed and accordingly the number of applications to which such a DAC is applied is increasing.

FIG. 1 shows a configuration of a general high speed DAC 10. As shown, the high speed DAC 10 includes a thermometer decoder 13 for promptly selecting a switch corresponding to input digital information in order to increase a selection speed of a current switch 17 connected to a current source 16, and pipelines 12 and 15 using flip-flops for process of individual words.

In more detail, input p-bit digital data are first provided to the first pipeline 12 through an input buffer 11. Then, some upper q bits in the p-bit digital data are delivered to the second pipeline 15 through the thermometer decoder 13 which outputs the upper q bits as bits of the combinable number of $(2^q-1)$, while the remaining (p-q) bits are delivered to the second pipeline 15 through a delay block 14 which delays a process time of the thermometer decoder 13 for the purpose of processing the (p-q) bits along with the q bits. An output $((2^q-1)+(p-q)$ bits) of the second pipeline 15 which processes outputs of the thermometer decoder 13 and the delay block 14 in parallel is used as a control signal of the current switch 17 to selectively output the current source 16 connected to the current switch 17, thereby providing a desired output current with a combination of segment current.

The current switch 17 and the current source 16 may be configured using various schemes, including, for example, a scheme of connecting switches to respective non-linear current sources to provide a desired output current, a scheme of outputting unit current sources through a combination of switches to provide a desired output current with a combination of outputs thereof, a scheme of operating switches to which linear current sources having respective weights based on binary values are connected to provide a desired output current with a combination of outputs thereof, a scheme of combining two or more of the above-mentioned schemes to provide a desired output current, etc.

The DAC 10 is operated in synchronization with clocks which provide operation periods of the first and second pipelines 12 and 15, and accordingly such a clock speed becomes an operation speed of the DAC 10. If an output of the DAC 10 is an NRZ (Non-Return-to-Zero) output, a discontinuous reference between output currents provided per clock becomes a clock period, which may limit a degree of precision. In order to overcome such a Nyquist band limitation (that is, a limitation of a use band to a clock frequency) and cope with a high speed wideband, up-converters must be connected in series, which may result in complexity of configuration.

As another method for achieving a high speed and wideband DAC, a configuration of converting an NRZ output to a RZ (Return-to-Zero) output may be additionally employed to extend a Nyquist band.

FIG. 2 shows examples of an NRZ output and a RZ output. As shown, placing an NRZ output signal in the left side of the figure on a zero point (0) one time per unit period as shown as an RZ output signal in the right side of the figure can double a Nyquist band. Accordingly, it is possible to achieve a wideband output without an additional up-converter.

FIG. 3 shows a partial configuration of an existing DAC for RZ output, where a switch 20 which provides a current source as an output is controlled by an RZ control signal.

Specifically, the existing DAC is configured such that a separate RZ controller 21 is added to control the switch 20 to output a ground potential every a period of clock for a predetermined time, while a control signal produced for DAC output (that is, switch selection data obtained from input digital data) is provided to the switch 20. The RZ controller 21 receives an RZ control signal and controls an output of the switch 20 to be an zero point (0) every a period of input clock based on the received RZ control signal. In this case, it is commonly configured such that the RZ output is automatically provided through the switch 20 according to a signal provided by the RZ controller 21 and a clock signal, and most of the RZ output provided through the switch 20 is forced to be the zero point during half or so a clock period.

However, such a configuration has to employ the above-mentioned separate RZ controller 21 and provide a signal which provides the RZ controller 21, which may result in increase in its load to be controlled, increase in power consumption for operation of the controller 21, and complexity of the configuration. In addition, since the clock signal, which is a digital signal, is directly coupled to the switch 20 for generating an analog signal, noise of the clock signal has an effect on the analog signal, which results in deterioration of system stability. In particular, if an output signal is forced to be coupled to a ground in order to put the output signal on a zero point using the clock signal, dynamic performance is deteriorated due to noise of the clock signal.

As an alternative, as shown in FIG. 4, it may be configured that, in addition to providing a control signal (that is, switch selection data obtained from input digital data) generated for DAC output to the switch 30 configured to provide RZ output, a re-sampling clock faster than the system clock is further provided to the switch 30, so that a current of the current source coupled to an output of the switch 30 can alternate with a zero point by the re-sampling clock.

However, since such a configuration also requires a configuration for generating the additional re-sampling clock for the RZ output and the re-sampling clock is directly provided to the RZ switch 30 which is an analog circuit, noise of the re-sampling clock has an effect on the analog signal, which results in deterioration of system stability.

In this manner, the existing configurations for RZ output require separate controller configurations or clocks, and when the existing configurations use the scheme of coupling an output signal to a ground using clocks, there arise a problem of deterioration of dynamic performance due to clock noise. Accordingly, there is an increasing need for an RZ DAC with efficient power consumption and size and improved dynamic performance.

SUMMARY OF THE INVENTION

In order to overcome the above problems, it is an object of the present invention to provide a return-to-zero digital to analog converter with efficient power consumption and size, which is capable of generating a return-to-zero (RZ) output signal without a separate controller and additional signals, and a converting method thereof.

It is another object of the present invention to provide a return-to-zero digital to analog converter which is capable of outputting an RZ output without directly providing a clock signal to an analog circuit by configuring a switch for generating a zero point signal and a differential pipeline for providing a differential signal to control the switch according to input digital data using a differential structure, and a converting method thereof.

It is still another object of the present invention to provide a return-to-zero digital to analog converter which is capable of minimizing an impedance change due to a switch operation by configuring four differential switches as a unit switch to determine an output of a current source and providing a differential signal so that the number of switches turned on in all operation modes is made equal, and a converting method thereof.

It is yet still another object of the present invention to provide a return-to-zero digital to analog converter which is capable of canceling a capacitance component by configuring four differential switches as a unit switch to determine an output of a current source and producing level switching processes of each differential switch in symmetry, and a converting method thereof.

To achieve the above objects, according to an aspect of the invention, there is provided a return-to-zero digital to analog converter including: a plurality of current sources; a switch part including a plurality of unit switches which is respectively connected to the current sources and outputs current from the current sources as one or both of a pair of differential outputs according to a plurality of differential switch inputs; and an RZ control signal generating part which provides, as the plurality of differential switch inputs, RZ control signals to cause the current from the current sources to be respectively output, with different signs, to one side and the other side of differential outputs of the unit switches or cause half of the current to be respectively output, with different signs, at once, to the one side and the other side of differential outputs of the unit switches when the unit switches are operated.

According to another aspect of the invention, there is provided a return-to-zero digital to analog converter including: a first pipeline which aligns digital data; a thermometer decoder which thermometer-decodes some outputs of the first pipeline; a dual-differential switching signal generating part which aligns outputs of the thermometer decoder and outputs, which are not provided to the thermometer decoder, of outputs of the first pipeline, and outputs two pairs of RZ control signals for each of the aligned outputs; a switch part including a plurality of unit switches each including two pairs of differential switches which are respectively coupled with outputs of the dual-differential switching signal generating part and provide a pair of differential outputs; and a plurality of current sources respectively connected to the unit switches of the switch part.

According to still another aspect of the invention, there is provided a converting method of a return-to-zero digital to analog converter, including: a configuring step of configuring a switch part with unit switches which output current from current sources to a pair of differential output terminals according to operation of two pairs of differential switches; an RZ control signal generating step of generating signals to select the unit switches from a digital signal for conversion, converting the generated signals to two pairs of RZ control signals for control of the two pairs of differential switches, and providing the two pairs of RZ control signals; and an RZ outputting step of outputting half of the current from the current sources to the differential output terminals, with different signs, at once, while the current of the current sources is alternately provided to the differential output terminals of the unit switches according to the RZ control signals.

According to an embodiment of the present invention, there is provided a return-to-zero digital to analog converter with efficient power consumption and size, which is capable of generating a return-to-zero (RZ) output signal without a separate controller and additional signals, and a converting method thereof.

According to an embodiment of the present invention, since a return-to-zero digital to analog converter and a converting method thereof are capable of outputting an RZ output without directly providing a clock signal to an analog circuit by configuring a switch for generating a zero point signal and a differential pipeline for providing a differential signal to control the switch according to input digital data using a differential structure, the converter can provide wideband characteristics and high dynamic performance.

According to an embodiment of the present invention, since a return-to-zero digital to analog converter and a converting method thereof are capable of minimizing an impedance change due to a switch operation by configuring four differential switches as a unit switch to determine an output of a current source and providing a differential signal so that the number of switches turned on in all operation modes is made equal, stability of the converter can be improved.

According to an embodiment of the present invention, since a return-to-zero digital to analog converter and a converting method thereof are capable of canceling a capacitance component by configuring four differential switches as a unit switch to determine an output of a current source and producing level switching processes of each differential switch in symmetry, stability of the converter can be improved.

BRIEF DESCRIPTION OF THE DRAWINGS

The above and/or other aspects and advantages of the present invention will become apparent and more readily appreciated from the following description of the embodiments, taken in conjunction with the accompanying drawings of which.

DETAILED DESCRIPTION OF THE PREFERRED EMBODIMENT

Hereinafter, the present invention will be described in detail by way of exemplary embodiments in conjunction with the accompanying drawings.

Figure 1:
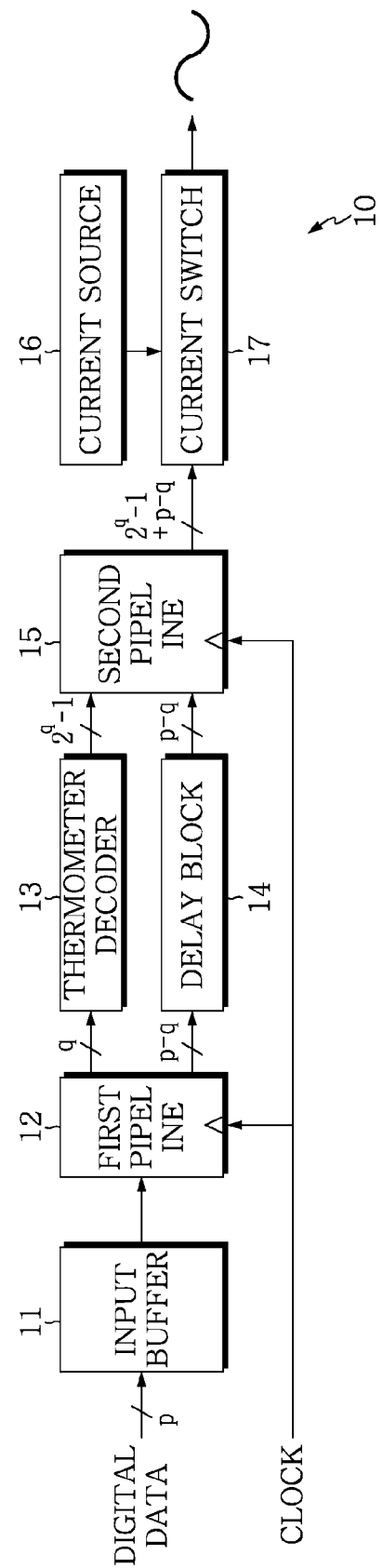
FIG. 1 is a block diagram of a general high speed digital to analog converter.
Figure 2:
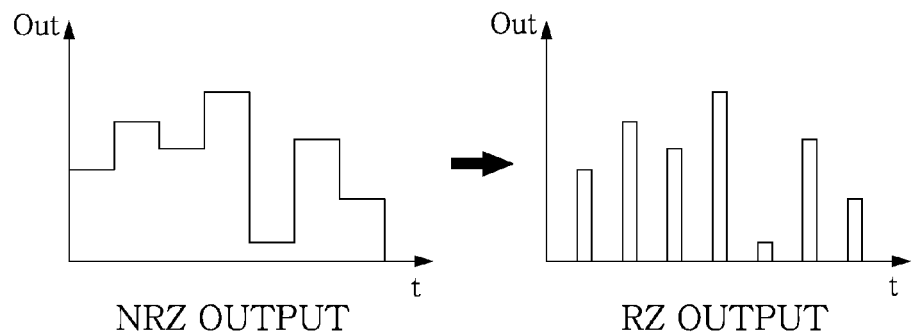
FIG. 2 is a view showing an example of return-to-zero output.
Figure 3:
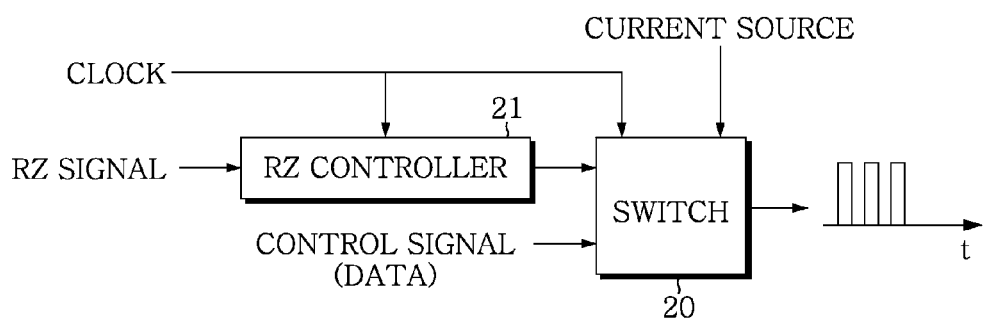
FIGS. 3 and 4 are views showing partial configuration of a digital to analog converter for return-to-zero output.
Figure 4:
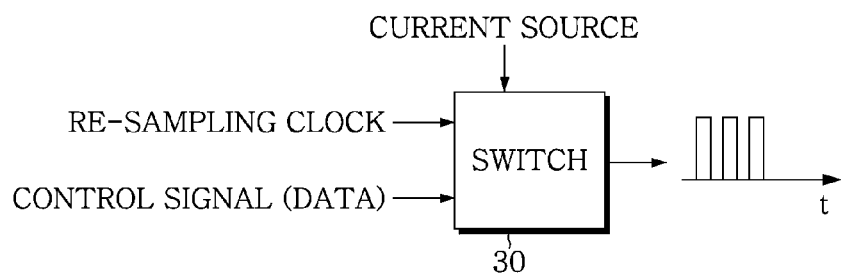
Figure 5:
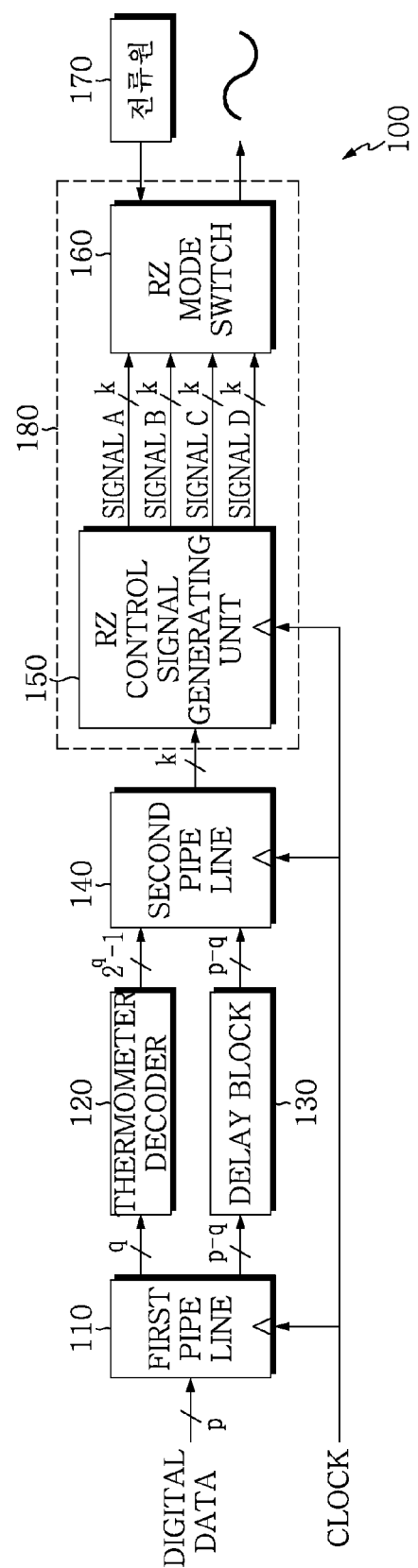
FIG. 5 is a block diagram showing a return-to-zero digital to analog converter according to an embodiment of the present invention.

FIG. 5 is a block diagram showing an exemplary return-to-zero digital to analog converter (RZ DAC) according to an embodiment of the present invention.

As shown, an RZ DAC includes a first pipeline 110 which aligns input digital data (p bits) for their parallel processing, a thermometer decoder 120 which analyzes some bits (q bits) of an output of the first pipeline 110 and provides an output of the combinable number ($2^q-1$) of the bits (q-bits) for high speed bit processing based on the analysis, a delay block 130 which delays a process time of the thermometer decoder 120 for the purpose of processing the remaining bits (p−q) along with the q bits, a second pipeline 140 which processes outputs of the thermometer decoder 120 and the delay block 130 in parallel, an RZ control signal generating unit 150 which outputs two pairs of RZ control signals (Signal A, signal B, signal C and signal D) for each of outputs ($2^q-1+p-q=k$) of the second pipeline 140, an RZ mode switch 160 which is constituted by a plurality of unit switches, each of which consists of two pairs of differential switches which are respectively coupled to the RZ control signals and provide a pair of differential outputs, and a current source 170 connected to the RZ mode switch 160. Note that the number of RZ control signals of the RZ control signal generating unit 150 and the number of differential switches constituting the unit switches depend on embodiments.

The plurality of unit switches constituting the RZ mode switch 160 is configured to be connected to a plurality of respective individual current sources constituting the current source 170 to determine their output. The unit switches provide RZ outputs by being controlled to generate an interval during which halves of current of the current source are output, with different polarities, to each of the pair of differential outputs so that their sum becomes zero while alternately outputting the current of the connected current source as one of the pair of differential outputs according to the two pairs of RZ control signals provided by the RZ control signal generating unit 150. In the following description, for convenience' sake, a mode where halves of the current of the current source coupled with the differential outputs are output with different polarities so that their sum becomes zero is called 'common mode.'

In the shown configuration, a system clock is provided to the first pipeline 110, the second pipeline 140 and the RZ control signal generating unit 150, and a DAC output is provided in synchronization with such a system clock. The RZ control signal generating unit 150 provides an RZ control signal to the RZ mode switch 160 at a speed double as high as the system clock. For example, whenever a potential of the system clock is varied, different RZ control signals may be output. However, for the RZ output, the RZ control signal has to be set such that the unit switches operating in the RZ mode switch 160 once per a period of the system clock are in the common mode.

As can be seen from the shown configuration, the system clock is only provided up to the RZ control signal generating unit 150, but not directly provided to the RZ mode switch 160 which is an analog circuit. When the RZ mode switch 160 is operated by the RZ control signal of the RZ control signal generating unit 150 and if a clock signal is directly coupled to the analog circuit, possible dynamic performance deterioration may be eliminated.

In the meantime, the second pipeline 140 and the RZ control signal generating unit 150 are just separated from each other for the purpose of logical explanation, but may be indeed incorporated with each other, and the first and second pipelines 110 and 140 may be formed of flip-flops.

Figures 6, 7:
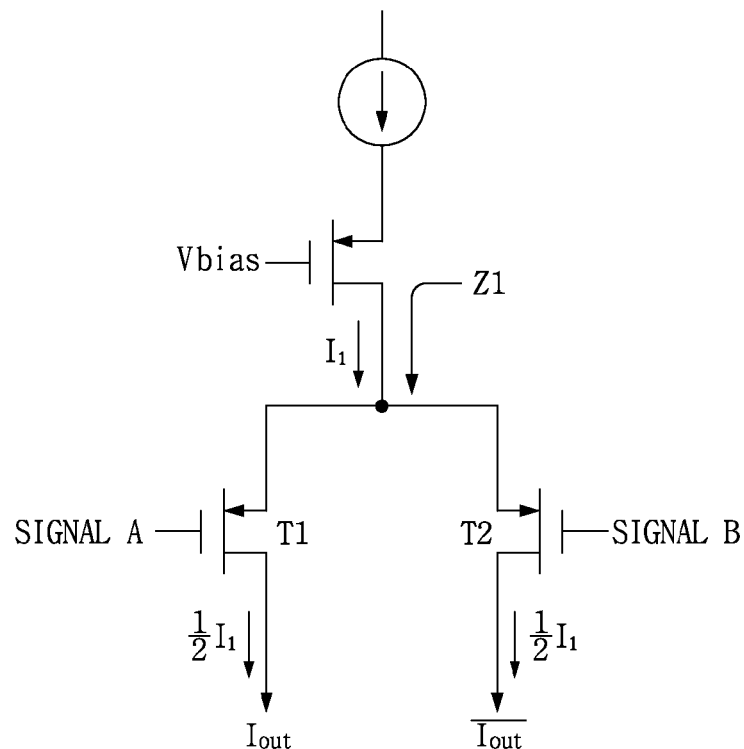
FIG. 6 is a unit switch circuit diagram according to an embodiment of the present invention.
FIG. 7 is a return-to-zero signal table according to an embodiment of the present invention.

FIG. 6 shows a unit switch configuration of the RZ mode switch according to another embodiment of the present invention. As shown, a unit switch includes a voltage bias switch connected to a current source, and a pair of identical differential switches T1 and T2, each of which is connected to the voltage bias switch. In operation, based on signals A and B to control the symmetrical differential switches T1 and T2, if only the left differential switch T1 is turned on, the entire current $I_1$ provided through the voltage bias switch from the current source is output ($I_1$) through the left differential switch T1 to a left differential output terminal Iout of a pair of differential output terminals Iout and $\overline{Iout}$, while, if only the right differential switch T2 is turned on, the entire current $I_1$ is output ($-I_1$) through the right differential switch T2 to a right differential output terminal $\overline{Iout}$. On the other hand, if both of the differential switches T1 and T2 are turned on at once, the current $I_1$ provided through the voltage bias switch is halved (½ $I_1$) with the differential switches T1 and T2, so that the left and right differential output terminals have their respective outputs of ½ $I_1$ and −½ $I_1$. In other words, since the pair of differential output terminals have the respective outputs having equal magnitude, the subtraction of the outputs leads to zero (0).

This may be confirmed through a table of FIG. 7 showing operation modes based on state of the RZ control signals (signal A and signal B).

As can be seen from the table of FIG. 7, when a system clock is in high potential, the unit switch alternately outputs $I_1$ and $-I_1$, and on the other hand, if the system clock is in low potential, the output of the unit switch enters the common mode, that is, becomes zero. Accordingly, there exists an interval during which the output of the unit switch returns to zero for output of RZ.

When the above-described configuration of FIG. 6 is applied to the RZ mode switch of FIG. 5 and the operation logic of FIG. 7 is applied to the RZ control signal generating unit, it is possible to realize the RZ DAC without a separate complicated control circuit or additional signals.

However, the shown configuration of FIG. 6 may have a problem that impedance Z1 of a common source node to which the differential switches are connected is varied depending on state of the differential switches.

In other words, since impedance Z1 when the entire current $I_1$ flows through one differential switch T1 or T2 under the state where the differential switch T1 or T1 is turned on is different from impedance Z1 when the entire current $I_1$ is halved with two differential switches T1 and T2 under the state where both of the differential switches T1 and T2 are turned on, a voltage of the common source node of the differential switches swings depending on a switch operation, which may have a fatal effect on stability of the DAC.

In addition, since a capacitance component CGD is generated between a gate and a drain of a transistor actually implementing each differential switch depending on variation of the RZ control signal for control of the differential switches T1 and T2, there may exist a point of time when an undesired output is provided, which may also result in deterioration of dynamic performance.

Figure 8:
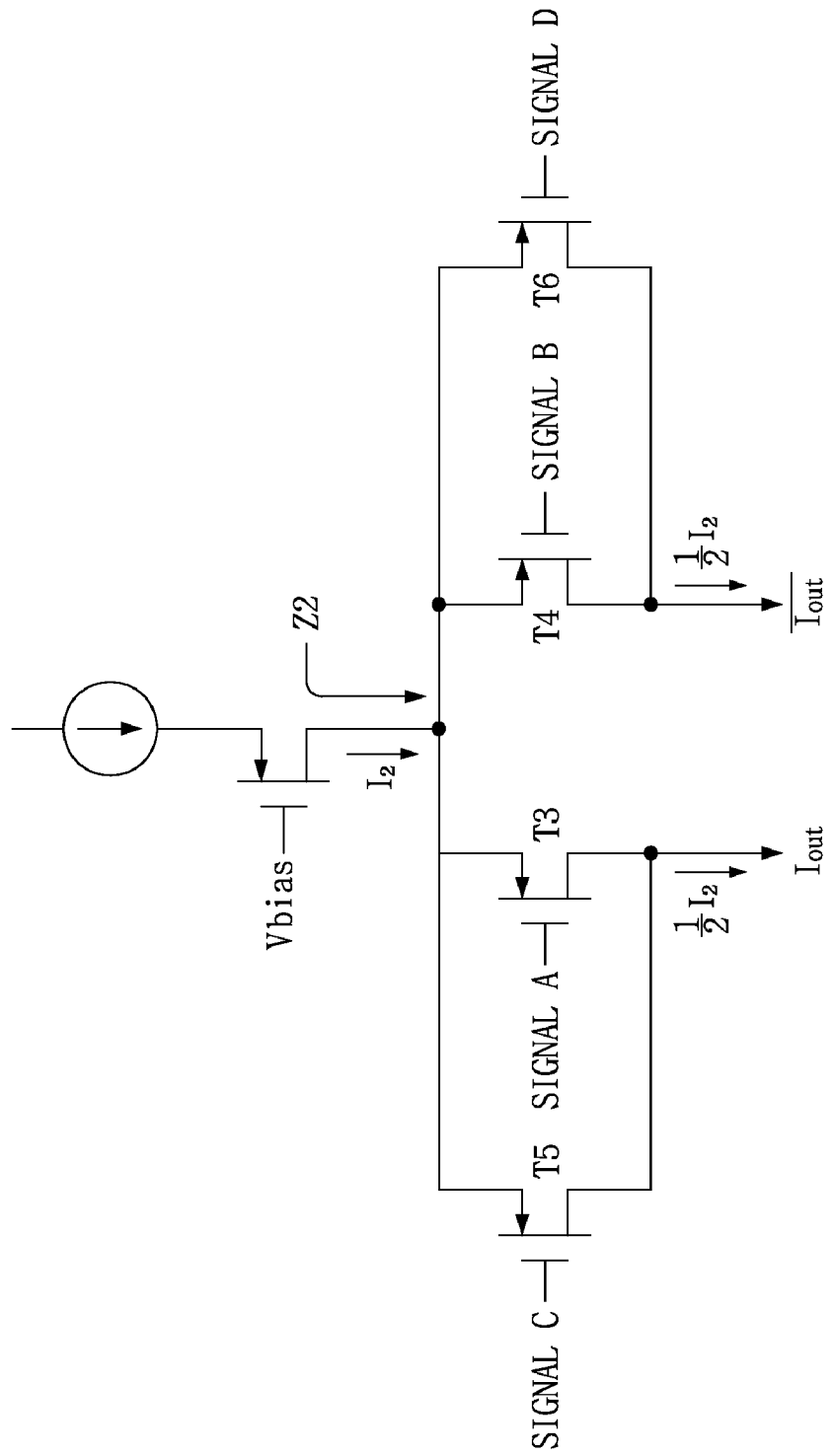
FIG. 8 is a unit switch circuit diagram according to another embodiment of the present invention.

FIG. 8 shows modified unit switch circuit configuration having two pairs of symmetrical differential switches T2/T4; T5/T6, which is capable of preventing the voltage of the common source node from being varied depending on the operation of the differential switches. As shown, when drains of the symmetrical switches are interconnected to configure differential output terminals Iota and $\overline{\text{Iout}}$, additional differential switches are substantially connected in parallel to their corresponding differential switches in the differential switch configuration shown in FIG. 6.

The four differential switches constituting the unit switch circuit shown in FIG. 8 are respectively controlled by a total of 4 control signals (signal A, signal B, signal C and signal D), signals A and B of which may be provided equal to the signals provided for the configuration shown in FIG. 6.

The increase in the number of differential switches as in the shown unit switch of FIG. 8 allows a variety of differential switch control combinations for outputting a current $I_2$ provided through a bias switch from a current source to the differential output terminals Iout and $\overline{\text{Iout}}$. In this case, in determining a sequence of control combinations such that outputs of the pairs of differential output terminals become ½ $I_2$ and ½ $I_2$, respectively, while $I_2$ and $-I_2$ are alternately output to the pairs of differential output terminals for RZ output, there must be a limitation that the number of turned-on differential switches is always equal to the number of turned-off differential switches. When the unit switch is operated with the number of turned-on differential switches always equal to the number of turned-off differential switches, source node impedance Z2 of the differential switches can always have an equal value, which may result in a uniform voltage of a corresponding node. In the meantime, as indicated by a dashed line 210 in FIG. 9, by keeping at least one of the differential switches T3 and T4 being turned on (consequently, keeping any two differential switches being turned on since the differential switches T5 and T6 connected in parallel by additional inverted RZ control signals) so that the current source can provide a current, in whatever form, to the differential output terminals while the corresponding unit switch is being operated, it is possible to minimize the entire variation of current flow or voltage, which may result of improved output stability.

Figure 9:
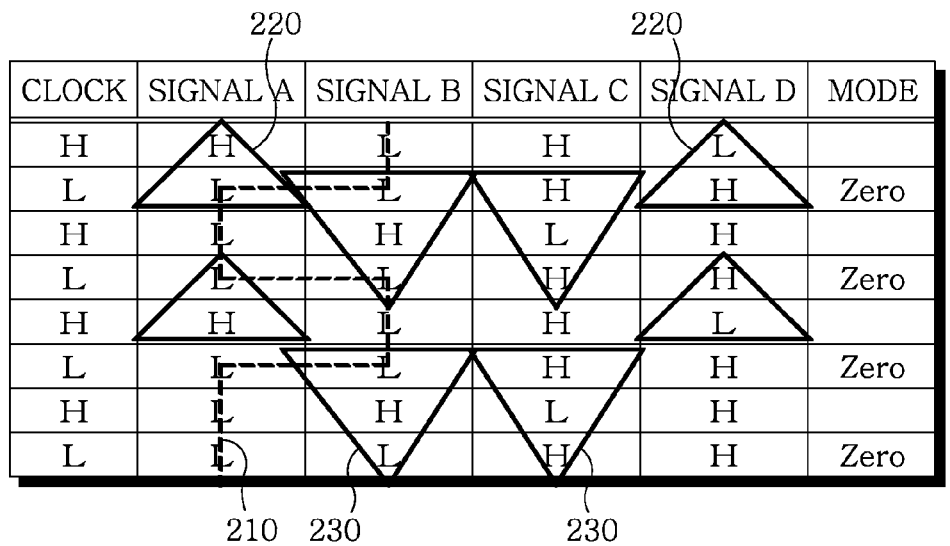
FIG. 9 is a return-to-zero signal table according to an embodiment of the present invention.

FIG. 9 shows a sequence of RZ control signals for generating RZ output by controlling the differential switches shown in FIG. 8. FIG. 9 also shows a configuration where an RZ control signal is modified, depending on potential variation of a system clock, to become a signal to cause one of two RZ control signal outputs according to a system clock of one period to be a common mode output.

The shown sequence of the RZ control signal is provided from the RZ control signal generating unit of FIG. 5. It can be seen from the shown signal configuration that signals A and D are in an inversion relationship and signals B and C are also in an inversion relationship and, as a result, substantial signals are signals A and B. Signal D, which is an inversion of signal A, is provided as a control signal of the differential switch T6 connected in parallel to the differential switch T4 symmetrical to the differential switch T3 controlled by signal A, while signal C, which is an inversion of signal B, is provided as a control signal of the differential switch T5 connected in parallel to the differential switch T3 symmetrical to the differential switch T4 controlled by signal B. Accordingly, the added differential switches T5 and T6 can be used to maintain the number of turning-on/off of the differential switches depending on operation mode of the differential switches T3 and T4 operated by signals A and B which are substantial RZ control signals.

In other words, in both of a case where outputs of the pairs of differential output terminal become $I_2$ and $-I_2$ and a case where outputs of the pairs of differential output terminal become ½ $I_2$ and $-12$ $I_2$, two differential switches can be always turned on, while always turning off the remaining two differential switches. Accordingly, the impedance Z2 of the source node to which sources of the differential switches are connected in common is unchanged irrespective of the operation mode of the differential switches, and accordingly a voltage of the corresponding source node is also unchanged. As a result, operation characteristics can be improved, which may result in high output quality of the RZ DAC.

In the meantime, although the performance of the DAC may be deteriorated due to a capacitance component CGD between a gate and a drain of each of differential switches, which is generated when the control signals are provided to the differential switches, in addition to the variation of impedance of the common source node, it can be seen from triangular patterns 220 and 230 indicated in FIG. 9 that the potential of RZ control signals for the symmetrical differential switches are always inverted at a point of time when turning-on/off of the differential switches at one side is varied as the potential of the RZ control signals is changed, thereby canceling change of the capacitance component for the entire unit switch.

In other words, when the shown unit switch structure of FIG. 8 and the RZ control signals of FIG. 9 are used, although the system clock is not directly provided, the RZ output can be provided while the current source output and the common mode output are alternately output every system clock, and one or more of the differential switches can be always kept turned on so that the current provided by the current source can always flow uniformly under the state where the unit switch is operated. In addition, even when the RZ control signals are changed, the power source of the entire system is prevented from being changed and the impedance and voltage of the common node source are prevented from being changed by always keeping the number of differential switches constant. In addition, the capacitance component of the differential switches, which is produced due to the change of the RZ control signal, can be canceled by causing the differential switches to be operated inversely. Such implementation of relatively simple control sequence can suppress most change of electrical characteristics which may be generated due to the operation of the unit switch, which may result in high level of dynamic performance.

Figure 10:
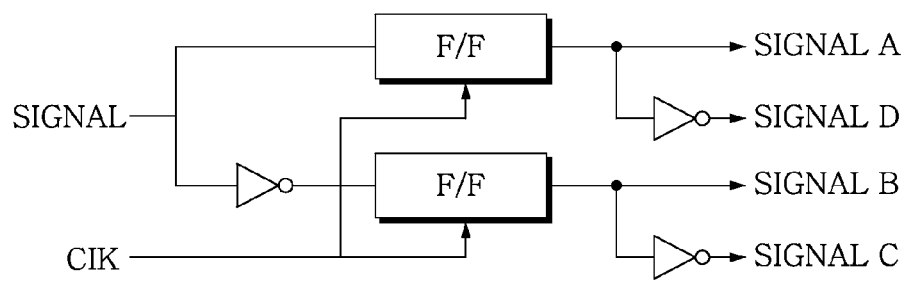
FIG. 10 is a brief conceptual view of a dual-differential switching signal generating unit according to an embodiment of the present invention.

FIG. 10 shows an example of a dual-differential switching signal generating unit which is an integration of the second pipeline 140 and the RZ control signal generating unit 150 shown in FIG. 5. Specifically, FIG. 10 shows an example where two pairs of RZ control signals are generated for each of k-bit signals applied to the second pipeline 140 according to a system clock. Although this dual-differential switching signal generating unit substantially requires a flip-flop and switch configuration for generating the RZ control signals shown in FIG. 9 according to the change of the system clock using a clock signal and its inverted clock signal, since this unit can be designed in various ways based on the shown RZ control signal sequence of FIG. 9, the corresponding portion is simplified as a flip-flop part as shown in FIG. 10. The shown configuration of FIG. 10 is for explaining a method of generating two pairs of RZ control signals for each of k-bits signals produced by processing a digital signal. As shown, when an input signal and its inverted signal are respectively provided to the flip-flop part (substantially a part which aligns signals and generates reference RZ control signals (signal A and signal B) by means of flip-flops) operated by the system clock, signals respectively provided through the flip-flop part and their inverted signals are provided as RZ control signals.

Accordingly, there is no need of separate signals and complicated controller configuration for generating these RZ control signals, which results in simple configuration.

Figure 11:
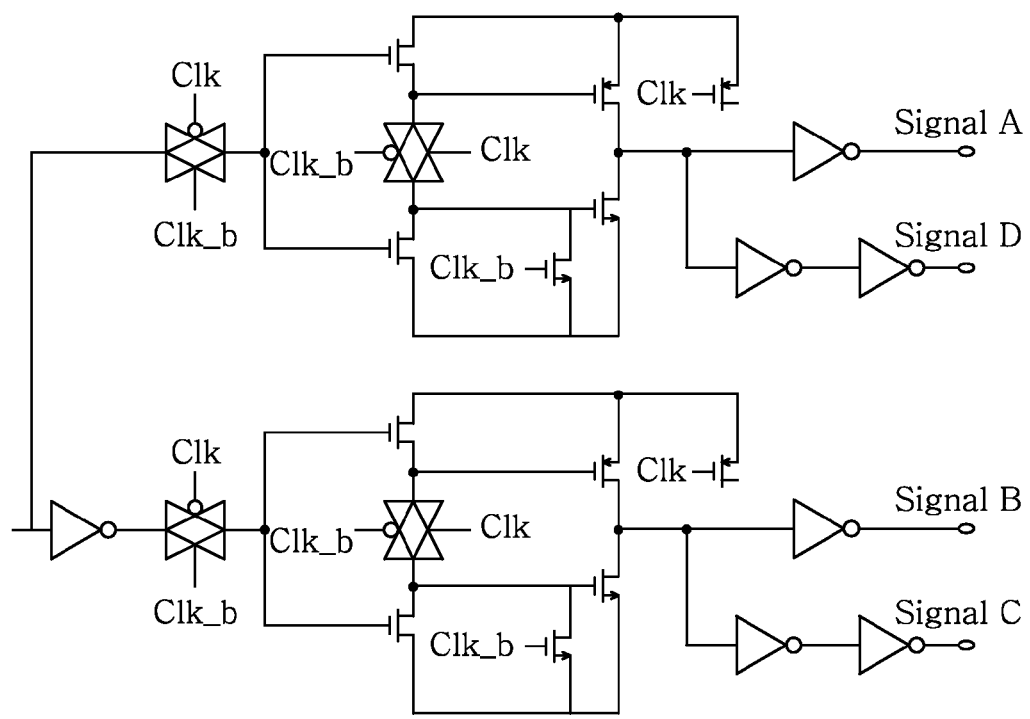
FIG. 11 is a circuit diagram of a dual-differential switching signal generating unit according to an embodiment of the present invention.

FIG. 11 is a detailed circuit diagram of the dual-differential switching signal generating unit shown in FIG. 10 according to an embodiment of the present invention. The shown configuration of FIG. 11 allows for generation of desired signals only with relatively simple configuration.

While the present invention has been particularly shown and described with reference to exemplary embodiments thereof, it will be understood by those skilled in the art that various changes in form and details may be made therein without departing from the spirit and scope of the present invention. The exemplary embodiments are provided for the purpose of illustrating the invention, not in a limitative sense. Thus, it is intended that the present invention covers the modifications and variations of this invention provided they come within the scope of the appended claims and their equivalents.

What is claimed is:

1. A return-to-zero digital to analog converter comprising:
    a plurality of current sources;
    a switch part including a plurality of unit switches which is respectively connected to the current sources and outputs current from the current sources as one or both of a pair of differential outputs according to a plurality of differential switch inputs; and
    an RZ control signal generating part which provides, as the plurality of differential switch inputs, RZ control signals to cause the current from the current sources to be respectively output, with different signs, to one side and the other side of differential outputs of the unit switches or cause half of the current to be respectively output, with different signs, at once, to the one side and the other side of differential outputs of the unit switches when the unit switches are operated.

2. The return-to-zero digital to analog converter according to claim 1, wherein the RZ control signal generating part receives a system clock and outputs different RZ control signals whenever a phase of the system clock is changed.

3. The return-to-zero digital to analog converter according to claim 1, further comprising:
    a first pipeline which aligns an external digital signal;
    a thermometer decoder which thermometer-decodes an output corresponding to some upper outputs of the first pipeline; and
    a second pipeline which aligns outputs of the thermometer decoder and the remaining lower outputs of the first pipeline and provides each unit switch operating signals to the RZ control signal generating part.

4. The return-to-zero digital to analog converter according to claim 1, wherein the unit switches each have a differential structure having two or more pairs of differential switches, and the RZ control signal generating part provides the plurality of differential switch inputs such that the same number of differential switches is always turned on or off in the unit switches.

5. The return-to-zero digital to analog converter according to claim 1, wherein the unit switches each have two differential switches, and the RZ control signal generating part provides a pair of differential switch input signals and inversion of the pair of differential switch input signals in symmetry.

6. The return-to-zero digital to analog converter according to claim 5, wherein the second pipeline and the RZ control signal generating part are integrated with each other and include a flip-flop part which stores and aligns the outputs of the thermometer decoder and the remaining lower outputs of the first pipeline and inversion thereof according to an external system clock and generates the RZ control signals, and a differential signal output part which directly provides and inverts outputs of the flip-flop part as four outputs.

7. The return-to-zero digital to analog converter according to claim 1, wherein the RZ control signal generating part provides the plurality of differential switch input signals such that at least one switch is always turned on with respect to at least one pair of differential switch inputs of the differential switch inputs of the unit switches.

8. The return-to-zero digital to analog converter according to claim 1, wherein the RZ control signal generating part provides the plurality of differential switch input signals such that differential switch inputs with inverted signal phases of the differential switch inputs of the unit switches are in symmetry.

9. A return-to-zero digital to analog converter comprising:
    a first pipeline which aligns digital data;
    a thermometer decoder which thermometer-decodes some outputs of the first pipeline;
    a dual-differential switching signal generating part which aligns outputs of the thermometer decoder and outputs, which are not provided to the thermometer decoder, of outputs of the first pipeline, and outputs two pairs of RZ control signals for each of the aligned outputs;
    a switch part including a plurality of unit switches each including two pairs of differential switches which are respectively coupled with outputs of the dual-differential switching signal generating part and provide a pair of differential outputs; and
    a plurality of current sources respectively connected to the unit switches of the switch part.

10. The return-to-zero digital to analog converter according to claim 9, wherein the dual-differential switching signal generating part receives a system clock and outputs different RZ control signals whenever a phase of the system clock is changed.

11. The return-to-zero digital to analog converter according to claim 9, wherein the unit switches of the switch part include:
    voltage bias switches respectively connected to the current sources; and
    two pairs of differential switches respectively connected to the voltage bias switches,
    wherein outputs of the symmetrical differential switches are interconnected to be provided as a pair of differential outputs.

12. The return-to-zero digital to analog converter according to claim 9, wherein the dual-differential switching signal generating part provides RZ control signals to the differential switches of the unit switches such that half of current from the current sources is output, with different signs, at once, as the pair of differential outputs while the current from the current sources is alternately output as each of the differential outputs of the unit switches.

13. The return-to-zero digital to analog converter according to claim 9, wherein the dual-differential switching signal generating part provides RZ control signals to the differential switches of the unit switches such that the number of turned-on differential switches becomes always equal to the number of turned-off differential switches when the unit switches are operated.

14. The return-to-zero digital to analog converter according to claim 9, wherein the dual-differential switching signal generating part provides RZ control signals to the differential switches of the unit switches such that differential switches whose turn-on/off state is changed in different directions when the unit switches are operated is in symmetry.

15. The return-to-zero digital to analog converter according to claim 9, wherein the dual-differential switching signal generating part includes a flip-flop part which stores and aligns the outputs of the thermometer decoder and the outputs, which are not provided to the thermometer decoder, of the outputs of the first pipeline, and inversion thereof according to an external system clock and generates the RZ control signals, and a differential signal output part which directly provides and inverts outputs of the flip-flop part as four outputs.

16. A converting method of a return-to-zero digital to analog converter, comprising:
 a configuring step of configuring a switch part with unit switches which output current from current sources to a pair of differential output terminals according to operation of two pairs of differential switches;
 an RZ control signal generating step of generating signals to select the unit switches from a digital signal for conversion, converting the generated signals to two pairs of RZ control signals for control of the two pairs of differential switches, and providing the two pairs of RZ control signals; and
 an RZ outputting step of outputting half of the current from the current sources to the differential output terminals, with different signs, at once, while the current of the current sources is alternately provided to the differential output terminals of the unit switches according to the RZ control signals.

17. The converting method according to claim 16, wherein the RZ control signal generating step includes receiving a system clock and providing different RZ control signals whenever a phase of the system clock is changed.

18. The converting method according to claim 17, wherein the RZ control signal generating step include providing RZ control signals such that half of current from the current sources is output, with different signs, to the differential output terminals of the unit switches at one of phases of the system clock.

19. The converting method according to claim 16, wherein the RZ control signal generating step includes providing RZ control signals to the differential switches of the unit switches such that the number of turned-on differential switches becomes always equal to the number of turned-off differential switches when the unit switches are operated.

20. The converting method according to claim 16, wherein the RZ control signal generating step includes providing RZ control signals to the differential switches of the unit switches such that differential switches whose turn-on/off state is changed in different directions when the unit switches are operated is in symmetry.

* * * * *